United States Patent [19]

Leidich

[11] 4,232,273
[45] Nov. 4, 1980

[54] PNP OUTPUT SHORT CIRCUIT PROTECTION

[75] Inventor: Arthur J. Leidich, Flemington, N.J.

[73] Assignee: RCA Corporation, New York, N.Y.

[21] Appl. No.: 7,500

[22] Filed: Jan. 29, 1979

[51] Int. Cl.³ .......................... H03F 3/30; H03F 3/45
[52] U.S. Cl. .................................. 330/298; 330/255;
330/257; 330/261; 330/267; 330/311
[58] Field of Search .................. 330/207 P, 255, 257, 330/261, 265, 267, 288, 298, 311

[56] References Cited

U.S. PATENT DOCUMENTS

| | | | |
|---|---|---|---|
| 3,482,177 | 12/1969 | Sylvan | 330/256 |
| 3,500,218 | 3/1970 | Burwen | 330/265 X |
| 3,660,773 | 5/1972 | Free | 330/255 X |
| 3,760,288 | 9/1973 | Leonard | 330/255 |
| 3,896,393 | 7/1975 | Cave et al. | 330/207 P |

OTHER PUBLICATIONS

*Signetics*, "Linear Integrated Circuits", vol. 1, pp. 35–38, 1972.
*Linear Integrated Circuit D.A.T.A. Book*, Electronics Information Series, Ed. 19, D.A.T.A. Inc., pp. 187–189, Figures A358, A365, A367.

*Primary Examiner*—James B. Mullins
*Attorney, Agent, or Firm*—Paul J. Rasmussen; Allen LeRoy Limberg; Eric P. Herrmann

[57] ABSTRACT

A limit is placed upon the maximum collector current available from a common-emitter transistor in the driver stage of an amplifier provided with overall feedback from its output stage following the driver stage to its input stage preceding the driver stage. This limit is imposed by saturation of a transistor in the input stage, which is of complementary conductivity type to the common-emitter transistor and which applies its collector current as base current to the common-emitter transistor, limiting the voltage applied to its base circuit. The common-emitter transistor in the driver stage is provided with emitter degeneration resistance, so limiting the voltage applied to its base circuit results in limiting the drive capability of the driver stage. This prevents the overall feedback increasing the output current of the driver stage so much it interferes with restriction of the base-current drive whenever a tendency towards overly large current flow through the output transistor is sensed. This forestalls increased dissipation in the output transistor that might damage or destroy it.

12 Claims, 1 Drawing Figure

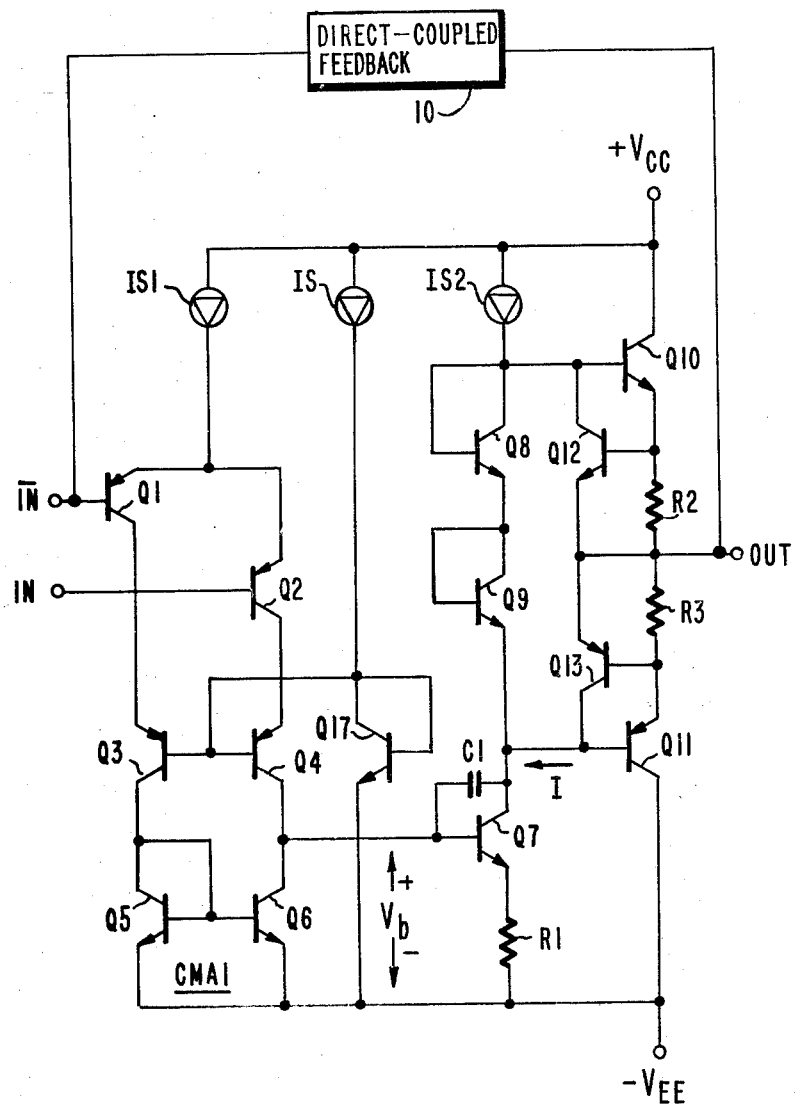

PNP OUTPUT SHORT CIRCUIT PROTECTION

The present invention is directed to an improved overcurrent protection circuit for amplifiers.

An often-used overcurrent protection circuit includes a current sensing resistor in the emitter circuit of the output transistor of the amplifier. The potential drop appearing across this resistor responsive to the emitter current of the output transistor is applied between the emitter and base electrodes of a clamping transistor, which diverts base current away from the output transistor when its emitter current tends to become excessive. When an amplifier with this sort of overcurrent protection is provided with overall direct-coupled feedback, the feedback tends to override the effect of the clamping transistor by making ever more base current available to the output transistor. To preserve control of the base current available to the output transistor limiting of signal excursion at some point in the feedback loop is necessary.

The present invention is embodied in an amplifier wherein the limiting is carried out by the saturation of a transistor connected at its collector electrode to the base electrode of a complementary conductivity type provided with an emitter degeneration resistor.

The sole FIGURE of the drawing is a schematic diagram of an operational amplifier embodying the present invention.

In the FIGURE, transistors Q1 and Q2 are connected in long-tailed pair configuration with constant current generating means IS1 supplying current to an interconnection between their emitter electrodes. The inverting and non-inverting input terminals $\overline{\text{IN}}$ and IN are at the base electrodes Q1 and Q2, respectively, and are biased to a potential between the negative and positive operating potential terminals $-V_{EE}$ and $+V_{CC}$. Transistors Q3 and Q4 are in cascode connections with Q1 and Q2, respectively. The balanced responses provided by these cascode connections to difference in potentials applied to input terminals IN and $\overline{\text{IN}}$ are differentially combined by the balanced-to-single-ended signal conversion afforded by current mirror amplifier CMA 1.

CMA 1 comprises a master transistor Q5 and a slave transistor Q6, having their respective collector electrodes respectively connected to the input terminal of CMA 1 and to its output terminal. The emitter electrodes of Q5 and Q6 are connected to the common terminal of CMA 1 and thence to $-V_{EE}$. Q5 is provided with direct-coupled collector-to-base feedback, which applies an emitter-to-base potential to Q5 that conditions it to conduct the collector current of Q3, and which applies a like emitter-to-base potential to Q6 to cause it to demand a collector current similar to that of Q5.

The single-ended response to input signal that appears at the interconnection of the collector electrodes of Q4 and Q6 is applied to the base electrode of a driver transistor Q7. Q7 has an emitter resistor R1 connected between its emitter electrode and $-V_{EE}$. Under quiescent conditions a direct coupled feedback connection (not shown) between the output terminal OUT of the operational amplifier and its inverting input terminal $\overline{\text{IN}}$ completes a loop which adjusts the quiescent collector current demanded of Q7 to accept substantially all the current supplied by constant current generating means IS2, which current flows through the serial connection of self-biased potential offsetting transistors Q8 and Q9.

The level of current supplied by IS2 is of sufficient amplitude that when diverted to the base of transistor Q10, Q10 will support a collector current capable of damaging that transistor.

Transistors Q8 and Q9 have respective base-collector feedback connections for biasing them into conduction such that the potential generated across their respective collector-emitter circuits is one forward-biased base-emitter offset potential $V_{BE}$. The sum of their respective collector-emitter potentials creates an offset potential which is applied between the base electrodes of complementary output transistors Q10 and Q11 to bias them for efficient Class AB operation. In the absence of potential offset means between the base electrodes of Q10 and Q11 significant crossover distortion would occur in the output signal as is well known in the art. For the condition that the potential at OUT is midway between $+V_{CC}$ and $-V_{EE}$ the offset provided by Q8 and Q9 is sufficient to guarantee that Q10 and Q11 are both biased just into conduction; and for all other conditions Q10 or Q11 conduct in the alternative.

Transistor Q7 in conjunction with current source IS2 form a predriver for the output stage consisting of Q10 and Q11. Base current drive is supplied to Q10 when the instaneous collector current of Q7 is less than the output of IS2; concurrently the collector potential of Q7 is sufficiently high to reverse bias the base-emitter junction of Q11 and prevent current flow from its base electrode, thereby inhibiting current flow in its collector-emitter circuit. Alternately, base drive is provided to Q11 when the instantaneous collector current of Q7 exceeds the value of IS2. Simultaneously the collector circuit of Q7 shunts all of the current from IS2 away from the base of Q10 turning it off.

A pole setting capacitor C1 is typically provided between the base and collector electrodes of Q7 to establish the open loop frequency response of the amplifier.

Output transistors Q10 and Q11 have their respective emitter electrodes connected to the OUT terminal through relatively low value current sensing resistors R2 and R3 respectively. Current limiting transistor Q12 has its collector electrode connected at the base of Q10 and its base and emitter electrodes connected across resistor R2. On the condition that the emitter circuit of Q10 passes sufficient current to generate one $V_{BE}$ potential across R2, transistor Q12 is caused to conduct collector current to divert the current being supplied by IS2 from the base electrode of Q10 and thereby limit the current passed by Q10 to a safe value.

The maximum current which the circuit can apply to the base of Q10 is equal to and limited to the value of IS2. Current limiting transistor Q12 is designed to safely conduct such current in its collector-emitter conduction path.

Signal is applied to Q10 by modulating the current which is shunted away from the interconnection of devices Q8, Q10 and IS2 by the circuit including the collector-emitter path of Q7. The base drive current to Q10 is substantially the value IS2 minus the instantaneous collector current of Q7.

A degenerative-feedback loop is completed by direct-coupled feedback connection 10 between terminal OUT and inverting input $\overline{\text{IN}}$.

In the event that a low impedance short occurs between OUT and the positive supply, the circuit by virtue of the degenerative-feedback loop, will cause transistor Q11 to conduct to reduce the output potential.

The more direct and short, the more base drive is applied to Q11 and the harder it conducts. To prevent damage to Q11 it is necessary to limit its base drive to a value $I_{MAX}$ which is less than the amount sufficient to support a collector current capable of such damage.

Transistor Q13 having its base and emitter electrodes connected across current sensing resistor R3 and its collector electrode connected to the base electrode of Q11 is provided to divert base drive from Q11 in much the same way as Q12 limits base current to Q10. To effect this purpose the current I, flowing from the Q13 collector and Q11 base interconnection must be limited, in order for the collector current of Q13 to limit the base current of Q11. Limiting the value of current I to an amount $I_{MAX}$ for example, is achieved by limiting the collector current, $I_C$, of trasistor Q7 to a maximum value $I_{C-MAX}$ of $IS2+I_{MAX}$. The values of IS2 and $I_{MAX}$ are determined by standard design techniques for the particular process employed in the fabrication of the circuit and the desired output drive and functional characteristic to be produced at the circuit OUT terminal.

The maximum collector current passed by Q7 in this invention is established by limiting its base potential. Designating the collector, base and emitter currents of Q7 by $I_C$, $I_B$ and $I_E$ respectively, their interrelationship is given by $$I_E = I_B + I_C \quad (1)$$

and for transistors having large common-emitter forward curent-gain, $\beta$ which is typical for the state of the art in silicon devices, the base curent $I_B$ is insignificant relative to $I_E$ and $I_C$ so that $I_C$ equals $I_E$ to within a few percent.

The emitter current of transistor Q7 is established by the voltage applied across the degeneration resistor R1 in the emitter circuit, which current is equal to $$I_E = (V_b - V_{BE})/R1 \quad (3)$$

and $$I_{E-MAX} = [(V_{b-MAX} - V_{BE})/R1] \approx I_{C-MAX} \quad (4)$$

where $V_b$ is the potential at the base electrode of Q7 relative to $(-)V_{EE}$, $V_{BE}$ is the transistor base-emitter offset potential and R1 is the resistance value of resistor R1.

The maximum potential $V_{b-MAX}$ which can be attained at the base connection of Q7 is the potential at the collector of Q4 when Q4 is saturated. This is so because in this condition Q4 affords the least potential drop across its collector-emitter electrodes. Saturation occurs in Q4 when its collector current is less than the value its base current can support at any instant and results when Q6 is instantaneously biased to pass little or no current. The Q4 collector potential in saturation equals the potential at the emitter electrode of Q4 less its collector-emitter saturation potential $V_{sat}$. The emitter potential of PNP transistor Q4 is one $V_{BE}$ potential above its base potential. The base potential of Q4 is established for example at one $V_{BE}$ potential above supply potential. This is done in the drawing by a diode-connected transistor Q17 connected between $-V_{EE}$ supply and the base electrodes of Q3 and Q4 and forward-biased by current from current source IS.

Adding potentials in a loop starting at supply $-V_{EE}$ through the emitter base junction of Q17, through the base-emitter junction of Q4 then through the emitter-collector circuit of Q4 the maximum potential $V_{b-MAX}$ relative to supply $-V_{EE}$ is given by $$V_{b-MAX} = V_{BE17} + V_{BE4} - V_{sat4} \quad (5)$$

where the number in the subscript corresponds to the relevant transistor. The maximum potential VR1 appearing across resistor R1 is $V_{b-MAX}$ less the base-emitter offset of Q7 or $$V_{R1} = V_{BE17} + V_{BE4} - V_{sat4} - V_{BE7} \quad (6)$$

$$V_{R1} \approx V_{BE} - V_{sat} \quad (7)$$

assuming the base-emitter potentials of the different transistors to be approximately equal. Combining Eq (4 and 5)

$$I_{C-MAX} \approx (V_{BE} - V_{sat})/R1$$

The inclusion of the cascode connected transistor pair Q3 and Q4, between long-tailed transistor pair Q1 and Q2 and its associated double to single-ended active load CMA 1 provides a method of limiting the maximum output potential of CMA 1 relative to $-V_{EE}$. This in turn limits the emitter current of Q7 and thereby the base current to Q11 to maintain its emitter current within a safe level.

The current $I_{MAX}$ is designed to fall within a range of values and is not a specific current level.

Excessive current conducted in the emitter circuit of Q11 develops a potential across R3 turning on Q13. Q13 may be designed such that its collector current is at least an order of magnitude greater than the base current of Q11. Consequently the collector current of Q13 will dominate the current I and override the base current of Q11 for a relatively wide range of $I_{MAX}$. The value of resistor R3 is therefore determinative of the emitter current at which conduction of Q11 will be inhibited by depriving it of base current through the conduction of Q13.

Alternative means for establishing the base potential of cascode transistor Q4 may be provided. As a second example the collector-base feedback of Q17 might be replaced with a means for biasing Q17 into saturation and the saturation voltage of Q17 used to bias the base of Q4. In this instance the potential across R1 would equal $V_{sat17} - V_{sat4}$, which potential might be considerably less than $V_{BE} - V_{sat}$, and allow use of a smaller resistance R1. Nor is Q17 constrained to being an npn transistor as shown, but may be replaced by a suitably biased pnp, or a diode or other potential generating means.

In addition, the present state of the art in bipolar integrated circuit processing is sufficiently advanced to permit accurate determination of each of the terms of Eq (6) such that the potential $V_{R1}$ applied across R1 can be minimized for the conditions concomitant with $I_{C-MAX}$ appearing in the collector circuit in Q7.

An alternate circuit may have as an input stage a suitably biased cascode amplifier as for example a stage comprising current source IS1, supplying bias current to cascode connected transistors Q2 and Q4 in turn series connected to a suitable load means, e.g., a Q6 biased as a current source. Thus one skilled in the art, armed with the foregoing, may conceive of numerous variations on the disclosed invention without departing from the spirit of the invention, and the scope of the invention should not be limited to the specific embodiments described.

What I claim is:

1. In an amplifier including an output transistor and a clamping transistor of a first conductivity type, each with first and second electrodes and a principal controlled conduction path therebetween and with a control electrode, the conduction of its principal conduction path being controlled responsive to potential between its first and control electrodes; means for connecting the principal conduction path of said output transistor to a load; a connection of the second electrode of said clamping transistor to the control electrode of said output transistor; a degenerative feedback connection between the principal conduction path of said output transistor and its control electrode; and means responsive to the current in the principal conduction path of said output transistor for applying a potential between the first and control electrodes of said clamping transistor, thereby to limit the potential between the first and control electrodes of said output transistor and to provide overcurrent protection for said output transistor, improved input amplifier means for inclusion before said output transistor in said degenerative feedback loop comprising:

a third transistor of said first conductivity type and a fourth transistor of a second conductivity type complementary to said first conductivity type, each of said third and fourth transistors having first and second electrodes and a principal controlled conduction path therebetween and having a control electrode, the conduction of its principal conduction path being controlled responsive to potential between its first and control electrodes;

means for applying input signal to the first electrode of said third transistor;

a connection of the second electrode of said third transistor to the control electrode of said fourth transistor;

resistive means having a first end connected to the first electrode of said fourth transistor and having a second end;

a connection of the second electrode of said fourth transistor to the control electrode of said output transistor; and means applying a potential of predetermined value between the second end of said resistive element and the control electrode of said third transistor, for determining the maximum value of said fourth transistor collector current irrespective of further increase in said input signal past that which supports that maximum value of said fourth transistor collector current.

2. An amplifier having a current-limited output comprising:

first and second terminals for applying supply potential therebetween;

a third terminal at which output signal is available;

first and second transistors of a first conductivity type and a third transistor of a second conductivity type complementary to the first, each having respective first and second electrodes and respective principal conduction paths therebetween, and having control electrodes, the principal conduction path of each transistor being controlled responsive to potential applied between its respective first and control electrodes;

resistive means having a first end connected at the first electrode of said third transistor and a second end connected at the first terminal;

current source means connected between the second terminal and a node connected to the control electrode of said first transistor, to which node the second electrode of said third transistor connects;

respective means connecting the first and second electrodes of the first transistor to the third and first terminals respectively;

means responsive to the current through the principal conduction path of said first transistor exceeding a prescribed value for diverting current from the control electrode of said first transistor;

means connecting the second electrode of the second transistor to the control electrode of the third transistor;

means for applying an input signal current to the first electrode of the second transistor; and means applying a potential of predetermined value between the first terminal and the control electrode of said second transistor, for determining the maximum value of current that can flow in said resistive means responsive to increase in said input signal current, irrespective of further increase in said input signal current past that required to support said maximum value of curent flow in said resistive means, and thereby limiting the maximum current to the control electrode of the first transistor.

3. An amplifier as set forth in claim 2 wherein said means for diverting current includes:

a current sensing resistor between the first electrode of the first transistor and said third terminal, also included in said means connecting the first electrode of the first transistor to the third terminal;

a fourth transistor of the first conductivity type having first, second and control electrodes; the first electrode of the fourth transistor being connected to the third terminal and the second and control electrodes of said fourth transistor respectively connected to the control and first electrodes of the first transistor.

4. An amplifier as set forth in claims 2 or 3 wherein the means for applying a potential to the control electrode of the second transistor comprises a further transistor having first and second electrodes and a principal conduction path therebetween and having a control electrode, the conduction of its principal conduction path being controlled by potential between its first and control electrodes, said further transistor biased to generate an offset potential between its control and first electrode, which offset potential is applied between the control electrode of the second transistor and the second end of the resistive means.

5. An amplifier having a current-limited output comprising:

first and second terminals for applying supply potential therebetween;

first and second transistors of a first conductivity type and a third transistor of a complementary conductivity type each having respective first and second electrodes and a respective principal conduction path therebetween and having a respective control electrode, the conduction path controlled responsive to potential between the respective control and first electrodes;

means connecting each of the second electrodes of the first and third transistors to the control electrode of the second transistor;

means connecting the first electrode of the first transistor to the first terminal;

a resistive means having first and second ends connected respectively to the first electrode of the second transistor and to the first terminal;

a first current source connected between the second terminal and the second electrode of the second transistor at which point output signal current is available;

a second current source connected between the second terminal and the first electrode of the third transistor for providing supply current to the third transistor;

means for applying input signal to the control electrode of the first transistor; and means for applying a potential between the first terminal and the control electrode of the third transistor, which potential being determinative of the maximum potential appearing across the resistive element, and thereby determinative of the maximum current passed in the principal conduction path of the second transistor.

6. An amplifier as set forth in claim 5 wherein the means for applying a potential comprises:

a fourth transistor having first, second and control electrodes, and having its second and control electrodes interconnected;

means biasing said fourth transistor into conduction for generating an offset potential between its control and first electrode; and means connecting the first and control electrodes of said fourth transistor for applying said offset potential between the first terminal and the control electrode of the third transistor.

7. An amplifier having a current limited output comprising:

a common-emitter output transistor amplifier including a first transistor having emitter, base and collector electrodes and an emitter degeneration resistor connecting its emitter electrode to a point of reference potential;

a second transistor of conductivity type opposite to the first transistor, having emitter, base and collector electrodes, and having its collector electrode connected at the base electrode to the first transistor;

respective means for supplying signal current to the base of the first transistor and supply current to the emitter electrode of the second transistor;

potential generating means connected between the base electrode of the second transistor and said point of reference potential for establishing substantially constant potential therebetween, so that the potential at the emitter electrode of said second transistor, when said second transistor is caused to saturate by the means for supplying signal current, establishes the maximum potential across and therefore the maximum current through said emitter degeneration resistor.

8. An amplifier as set forth in claim 7 wherein the means for applying signal current includes the collector-emitter circuit of the second transistor.

9. An amplifier as set forth in claim 7 wherein said potential generating means includes at least one semiconductor junction connected between the base electrode of said second transistor and said point of reference potential, and means for applying a bias current to said semiconductor junction for establishing an offset potential thereacross.

10. An amplifier as set forth in claim 9 wherein said means for applying a bias current is connected for forward biasing said semiconductor junction.

11. An amplifier as set forth in claim 7 wherein said potential generating means includes a further transistor having its collector-emitter conduction path connected between the base electrode of said second transistor and said point of reference potential, and means for applying a bias current to said further transistor for establishing a predetermined offset potential across its collector-emitter conduction path.

12. An amplifier as set forth in claim 11 wherein said means for applying a bias current includes a direct-coupled feedback connection between the collector and base electrodes of said further transistor.

* * * * *